(12) United States Patent
Wang et al.

(10) Patent No.: US 7,125,775 B1
(45) Date of Patent: Oct. 24, 2006

(54) METHOD FOR FORMING HYBRID DEVICE GATES

(75) Inventors: Kuilong Wang, Portland, OR (US);
Tsengyou Syau, Portland, OR (US);
Jeong Choi, Palo Alto, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 10/805,124

(22) Filed: Mar. 18, 2004

(51) Int. Cl.
*H01L 21/336* (2006.01)

(52) U.S. Cl. .................. 438/283; 438/287; 438/299; 438/301

(58) Field of Classification Search ............. 438/283, 438/287, 290, 299, 301, 303; 257/314, 326, 257/E21.623, E21.637
See application file for complete search history.

(56) References Cited

U.S. PATENT DOCUMENTS

| 6,518,151 | B1 * | 2/2003 | Dobuzinsky et al. ....... 438/551 |
| 6,534,414 | B1 | 3/2003 | Wang et al. |
| 6,790,719 | B1 * | 9/2004 | Adetutu et al. ............. 438/195 |

* cited by examiner

*Primary Examiner*—Hsien-Ming Lee
(74) *Attorney, Agent, or Firm*—Glass & Associates

(57) ABSTRACT

A method for forming self-aligned contact devices in a core region of a semiconductor substrate and non-self-aligned contact devices in a non-core region of the semiconductor substrate is disclosed in which a single gate film stack is used for forming gate structures in both the core region and in the non-core region. A dielectric layer is formed over a semiconductor substrate and a gate film stack is formed over the dielectric layer. The gate film stack is then patterned so as to form gate structures within both the core region and the non-core region.

12 Claims, 16 Drawing Sheets

METHOD FOR FORMING HYBRID DEVICE GATES

FIELD OF THE INVENTION

The present invention relates to the field of semiconductor devices. More particularly, the present invention relates to Complimentary Metal-Oxide Semiconductor (CMOS) manufacturing processes for forming self-aligned contact (SAC) and non-SAC devices on a semiconductor substrate.

BACKGROUND ART

In sub-micron Complimentary Metal-Oxide Semiconductor (CMOS) manufacturing self-aligned contact (SAC) technology has been successfully used to achieve chip size reduction. In conventional SAC processes structures that are to be connected with overlying layers using a self-aligned contact are closely spaced on the semiconductor substrate. An etch stop layer (e.g., silicon nitride) is formed over the structure that is to be contacted. One or more pre-metal dielectric layer is then deposited over the etch stop layer. An etch is then performed to form contact openings that extend through the pre metal dielectric layer. This etch stops on the etch stop layer. The exposed portions of the etch stop layer are then removed, exposing the structure that is to be contacted. A metal layer is then deposited and planarized to complete the self-aligned contact. The etch stop layer prevents over-etch, aligning the contact with the structure to be contacted and preventing current leakage that could result from improper alignment.

SAC processes allow for the use of closely spaced structures, giving high density semiconductor devices. However, the speed of devices formed with SAC processes is significantly less than the speed of devices formed with non-SAC processes.

Accordingly, what is needed is a process and structure that allows for forming CMOS devices that have both high density and high speed. The present invention meets the above needs.

DISCLOSURE OF THE INVENTION

The present invention provides for forming Self-Aligned Contact (SAC) devices in a core region of a semiconductor substrate and non-self-aligned contact (non-SAC) devices in a non-core region of the semiconductor substrate in which a single gate film stack is used to form gates in both the core region and the non-core region. This gives an integrated circuit device that includes the advantages of both high density (in the core region) and increased device speed (in the non-core region).

A method for forming self-aligned contact devices in a core region of a semiconductor substrate and non-SAC devices in a non-core region of the semiconductor substrate is disclosed. A gate film stack is formed that extends within both the core region and the non-core region. The core region and the non-core region are patterned to define gate structures both within the core region and within the non-core region. Conventional SAC processes are then used to form SAC devices (using the gate structures defined in the core region) in the core region and conventional dual-gate processes are used to form non-SAC devices (using the gate structures defined in the non-core region) in the non-core region.

The methods of the present invention utilizes a single gate film stack for forming gate structures in the core region and in the non-core region, forming a semiconductor device having both SAC and non-SAC devices. The resulting semiconductor device has the advantages of high density in the core region and high speed in the non-core region.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

FIGS. 1A–6D illustrate a method for forming self-aligned contact devices in a first region of a semiconductor substrate (core region) and non-self-aligned contact devices in a second region (non-core region) of the semiconductor substrate. The term "SAC devices" includes those types of semiconductor devices that use a self-aligned contact process for establishing a connection to gate structures and/or source and drain regions and includes semiconductor devices that include self-aligned contacts that couple to gate structures and/or source and drain structures. The term "non-SAC devices" includes those types of semiconductor devices that do not use a self-aligned contact process for establishing a connection to gate structures and/or source and drain regions and includes semiconductor devices that do not include self-aligned contacts that couple to gate structures and/or source and drain structures.

Figure 1A:
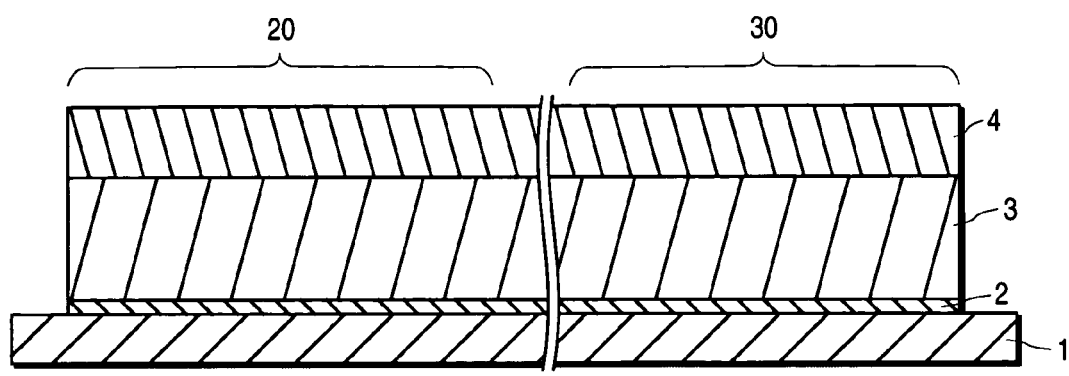
FIG. 1A shows a semiconductor substrate over which a dielectric layer, a gate layer and dielectric film have been formed in accordance with an embodiment of the present invention.
Figure 1B:
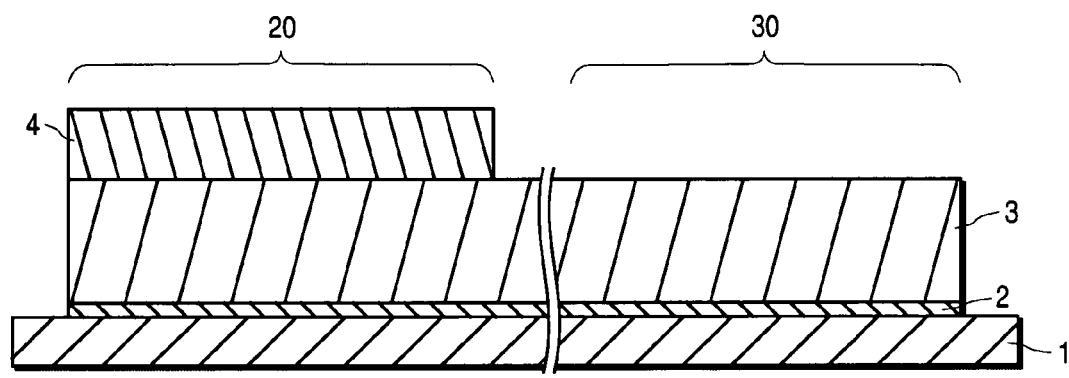
FIG. 1B shows the structure of FIG. 1A after that portion of the dielectric film that extends within the non-core region has been removed in accordance with an embodiment of the present invention.
Figure 1C:
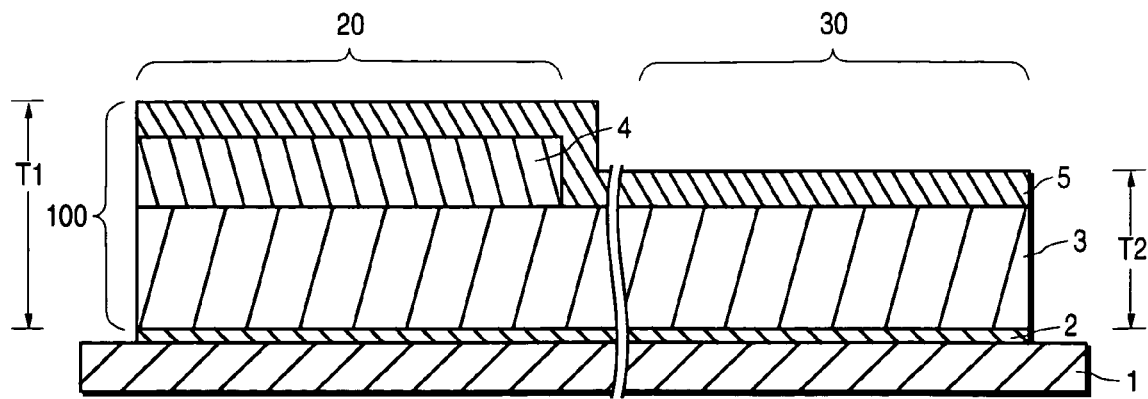
FIG. 1C shows the structure of FIG. 1B after an anti-reflective coating has been deposited so as to form a gate film stack that overlies a dielectric layer and that is thicker in the core region than in the non-core region in accordance with an embodiment of the present invention.

As shown by FIGS. 1A–1C a dielectric layer 2 and a gate film stack 100 are formed over semiconductor substrates. Semiconductor substrate 1 can be either N or P type and can include isolation regions (e.g., using shallow trench isolation processing steps) depending on the device requirements. Referring now to FIG. 1A, a dielectric layer 2 is formed over substrate 1. In the present embodiment dielectric layer 2 is formed by depositing or growing a layer of dielectric material over semiconductor substrate 1 such that dielectric layer 2 directly overlies substrate 1. In the present embodiment dielectric layer 2 is a thin layer (e.g. 5 to 100 Angstroms) of silicon dioxide ($SiO_2$) or other type of dielectric that extends within all of core region 20 and non-core region 30.

A gate film stack is formed that extends within both core and non-core regions. The gate film stack may comprise the same materials in both core region 20 and non-core region 30. Alternatively, the composition of the gate film stack can be different in core region 20 from the composition of the gate film stack in the non-core region 30. This can be achieved by selective deposition of material, deposition and partial removal of material, selective implantation, etc. Also, the gate film stack can be of uniform thickness (e.g., gate film stack 200 shown in FIGS. 5A–6D) or can be thicker in one region than in another region (e.g., gate film stack 100 shown in FIGS. 1C–4E).

FIGS. 1A–1C illustrate the formation of a gate film stack 100 that includes a gate layer 3, a dielectric film 4 and anti-reflective coating 5. In the present embodiment gate layer 3 is formed by depositing a layer of undoped polysilicon or amorphous silicon over dielectric layer 2 such that gate layer 3 immediately overlies dielectric layer 2. In one embodiment gate layer 3 includes 500–2000 Angstroms of amorphous silicon or polysilicon that is formed by depositing amorphous silicon in a furnace or by using a chemical vapor deposition process. Gate layer 3 includes an upper region that is more conductive than the remainder of gate layer 3. In the present embodiment gate layer 3 includes an upper region of polycide that is formed by depositing or growing a layer of silicide (e.g., tungsten silicide, titanium silicide, Cobalt silicide, etc.) over the layer of amorphous silicon or polysilicon. Though the present embodiment uses a silicide as an upper conductive region, it is appreciated that other methods and/or materials could be used to obtain an upper region that is more conductive than the remainder of gate layer 3.

Implant process steps are then performed so as to implant species within core region 20 as required to meet device and integration requirements. In the present embodiment non-core region 30 is covered with a photoresist mask and an N-type dopant is implanted such that only that portion of gate layer 3 within core region 20 is doped, producing an N-type gate layer 3 within core region 20. In one embodiment, non-core region 30 is doped following the implantation of core region 20. However, alternatively, non-core region 30 is doped at a later time in the process (e.g., after the steps illustrated in FIGS. 1A–1G have been performed).

Dielectric film 4 can be formed by depositing one or more layers of dielectric material over gate layer 3 such that dielectric film 4 directly overlies gate layer 3. In the present embodiment dielectric film 4 is a dielectric multi-layer film that includes both a dielectric hardmask and one or more layers of Anti-Reflective Coating (ARC). The hardmask can be a single layer of nitride or a single layer of oxide. Alternatively, the hardmask can include multiple layers such as, for example, both a layer of nitride and a layer of oxide. In the present embodiment the ARC is silicon oxynitride ($S_iO_xN_y$ and/or $Si_2O_2N$).

FIG. 1A shows a semiconductor substrate 1 after dielectric layer 2, gate layer 3 and dielectric film 4 have been formed. In the present embodiment each of dielectric layer 2, gate layer 3 and dielectric film 4 are deposited over the entire top surface of substrate 1. Accordingly, dielectric layer 2, gate layer 3 and dielectric film extend within all of core region 20 and non-core region 30.

Dielectric film 4 is then removed from non-core region 30. In the present embodiment dielectric film 4 is removed by masking core region 20 using a photoresist mask and etching the wafer to remove the exposed portions of dielectric film 4 so as to obtain the structure shown in FIG. 1B. In the present embodiment a fluorine based etch is used that includes a mixture of oxygen and/or nitrogen gas.

Anti-Reflective Coating (ARC) 5 is then formed by depositing one or more layers of anti-reflective material. In the present embodiment ARC 5 is a thin layer (200 to 1000 Angstroms) of silicon oxynitride ($S_iO_xN_y$ and/or $Si_2O_2N$) that is deposited over the entire substrate 1. Accordingly, ARC 5 will immediately overlie dielectric film 4 in core region 20 and will immediately overlie gate layer 3 in non-core region 30.

The resulting gate film stack 100, shown in FIG. 1C is a single structure that is formed, at the same time, in both core region 20 and non-core region 30, and extends, at the same time, within all of core region 20 and non-core region 30. In the present embodiment gate film stack 100 has a thickness (T1) in core region 20 that is thicker than its thickness (T2) in non-core region 30. In the present embodiment, gate film stack 100 is thicker in core region 20 as a result of the removal of dielectric film 4 from non-core region 30.

Dielectric layer 2 and gate film stack 100 are then patterned to define gate structures 31 in core region 20 and to define gate structures 32 in non-core region 30. Various different methods can be used to pattern dielectric layer 2 and gate film stack 100 such that, after the patterning process, gate structures are formed in both core region 20 and non-core region 30, from the same dielectric layer 2 and gate film stack 100.

In the embodiment illustrated in FIGS. 1D–2E gate film stack 100 is patterned using a dual-mask process in which core region 20 is patterned using a mask 6 that covers non-core region 30 and non-core region 30 is patterned using a mask 7 that covers core region 20. By etching core region 20 and non-core region 30 separately, using different masks, a better etch is obtained than would result from using a single mask (because of the difference in thickness between core region 20 and the non-core region 30).

Figure 1D:
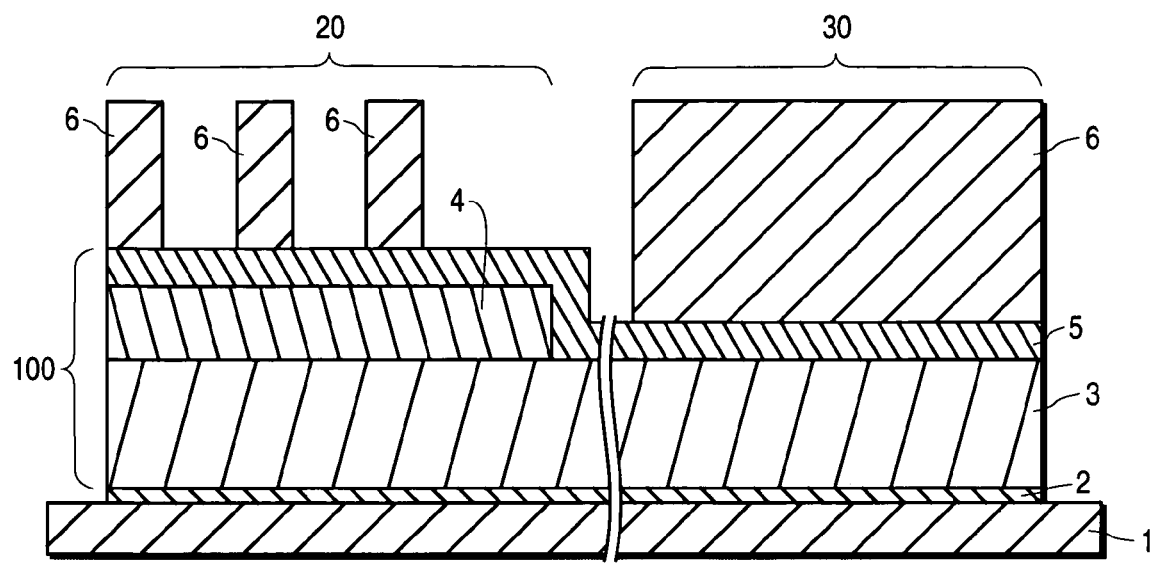
FIG. 1D shows the structure of FIG. 1C after a photoresist mask has been formed thereover in accordance with an embodiment of the present invention.

In the embodiment shown in FIG. 1D mask 6 is used to pattern dielectric layer 2 and gate film stack 100 in core region 20. In the present embodiment mask 6 is formed by depositing, exposing and developing a layer of photoresist so as to form a desired photoresist mask pattern. Mask 6 covers non-core region 30 and covers portions of core region 20. More particularly, in the present embodiment mask 6 covers those portions of core region 20 that define gate structures and that define lines, and covers all of non-core region 30 (covering all active areas within non-core region 30) except for a narrow region at the boundary between core region 20 and non-core region 30 where lines cross between masks 6 and 7.

Figure 1E:
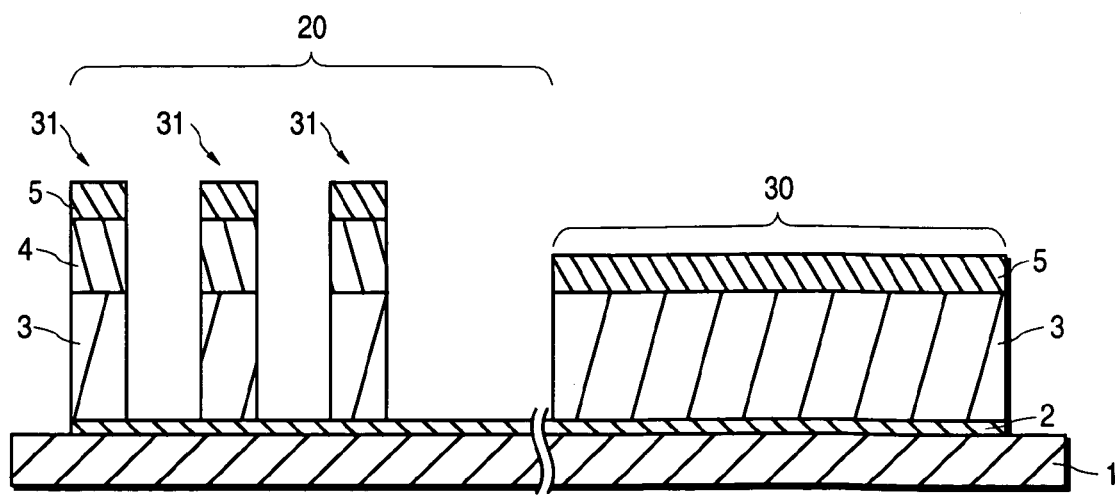
FIG. 1E shows the structure of FIG. 1D after an etch has been performed and after removal of the photoresist mask in accordance with an embodiment of the present invention.

An etch is then performed so as to remove those portions of ARC 5, dielectric film 4 and gate layer 3 that are not covered by mask 6, forming gate structures 31 shown in FIG. 1E. In the present embodiment a fluorine based etch is used to pattern ARC 5 and dielectric film 4, and a chlorine ($CL_2$)-hydrogen bromide (HBr)-based etch is used to pattern gate layer 3. The etch exposes portions of the substrate 1 and defines gate structures 31 in core region 20. In addition, this etch forms those portions of lines 21 that extend between core region 20 and non-core region 30.

Figure 1F:
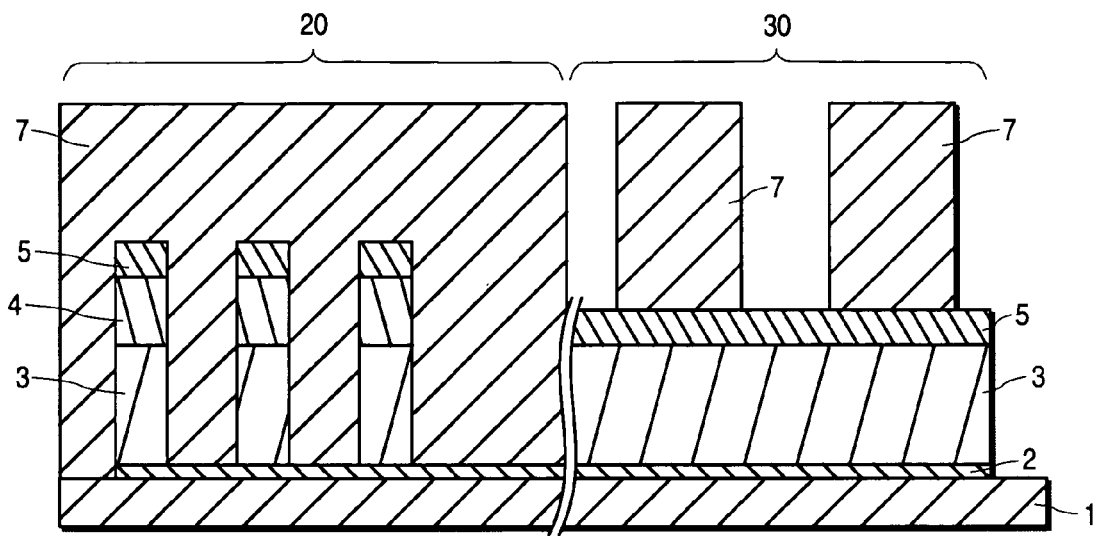
FIG. 1F shows the structure of FIG. 1E after a photoresist mask has been formed thereover in accordance with an embodiment of the present invention.

In the embodiment shown in FIG. 1F, mask 7 is used to pattern dielectric layer 2 and gate film stack 100 in non-core region 30. In the present embodiment mask 7 is formed by depositing, exposing and developing a layer of photoresist so as to form a desired mask pattern. Mask 7 covers all of core region 20 and portions of non-core region 30. More particularly, in the present embodiment mask 7 covers those portions of non-core region 30 that define gate structures and that define lines, and covers all of core region 20.

Figure 1G:
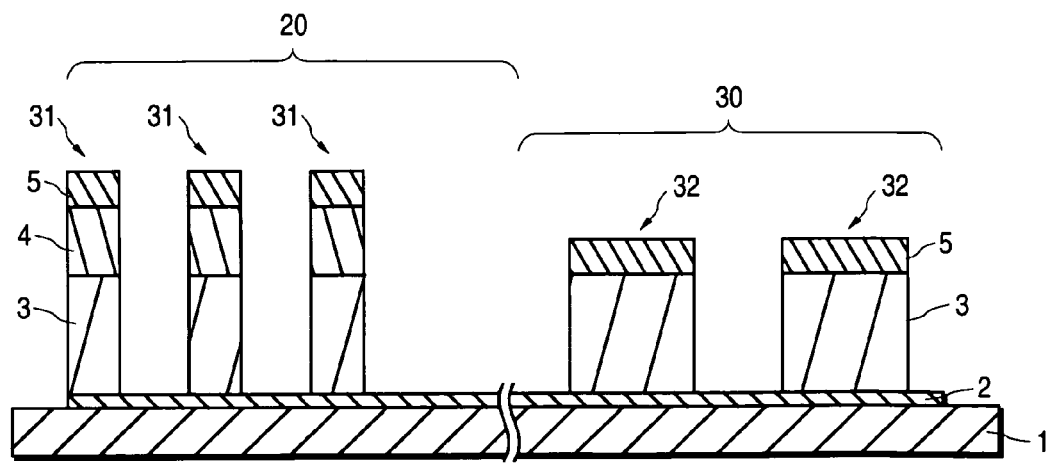
FIG. 1G shows the structure of FIG. 1F after an etch step has been performed and after removal of the photoresist mask in accordance with an embodiment of the present invention

An etch is performed so as to remove those portions of gate layer 3 and ARC 5 that are not covered by mask 7, forming the structures shown in FIG. 1G. In the present embodiment a fluorine based etch is used. In the present embodiment a fluorine based etch is used to pattern ARC 5 and a chlorine ($CL_2$)-hydrogen bromide (HBr)-based etch is used to pattern gate layer 3. The etch exposes portions of substrate 1 and defines gate structures 32 in non-core region 30. In addition, the etch forms portions of lines 21 within non-core region 30.

Figure 2A:
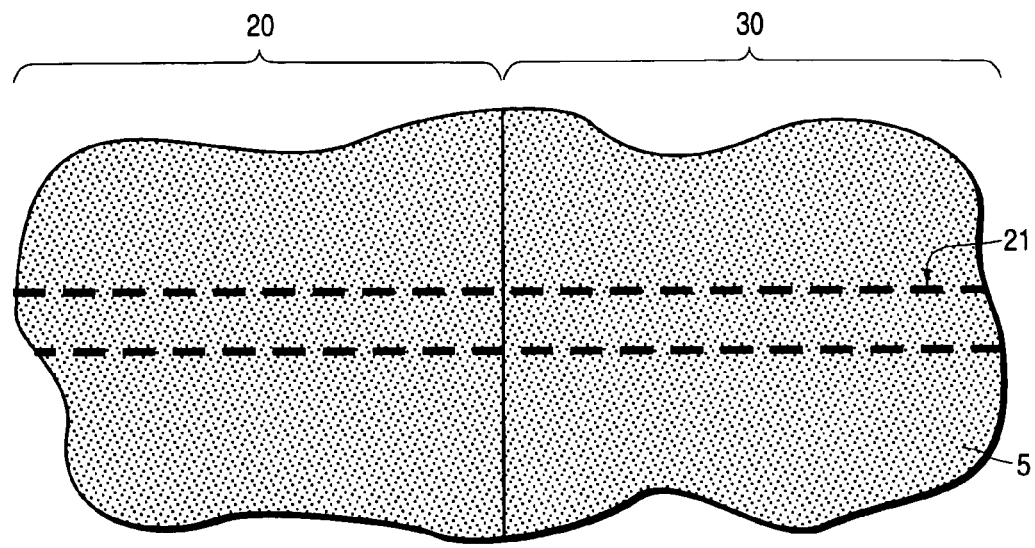
FIG. 2A shows a top view of the structure of FIG. 1C where a line (design) crosses between the core region and the non-core region, and illustrates a double-etch region in which the resist masks overlap in accordance with an embodiment of the present invention.
Figure 2B:
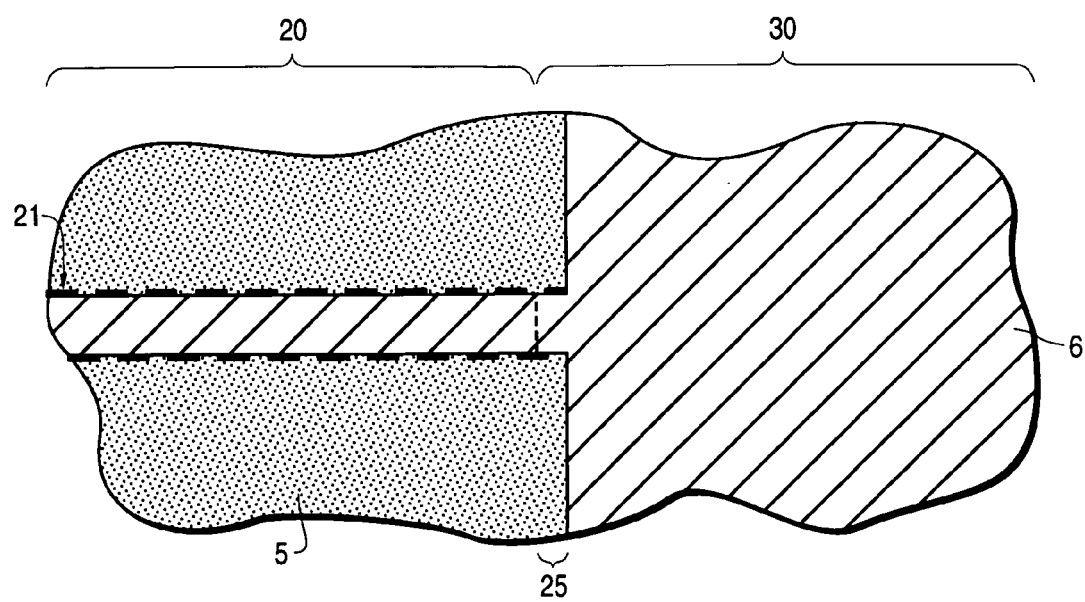
FIG. 2B shows a top view of the structure of FIG. 1D where a line crosses between the core region and the non-core region and illustrates how a first photoresist mask defines portions of the line in accordance with an embodiment of the present invention.
Figure 2C:
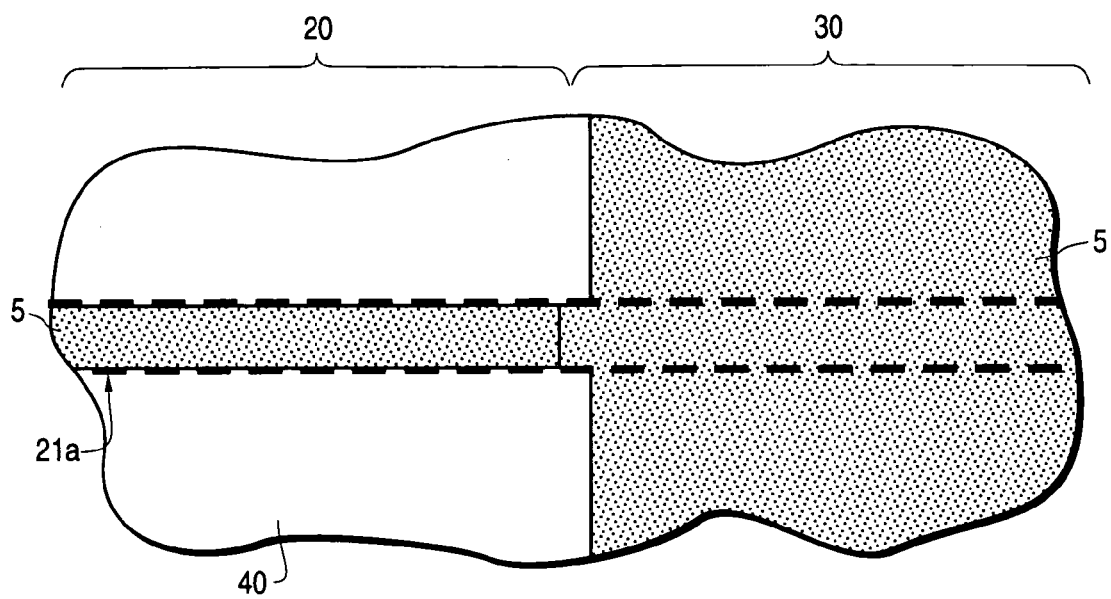
FIG. 2C shows a top view of the structure of FIG. 1E where a line crosses between the core region and the non-core region in accordance with an embodiment of the present invention.
Figure 2D:
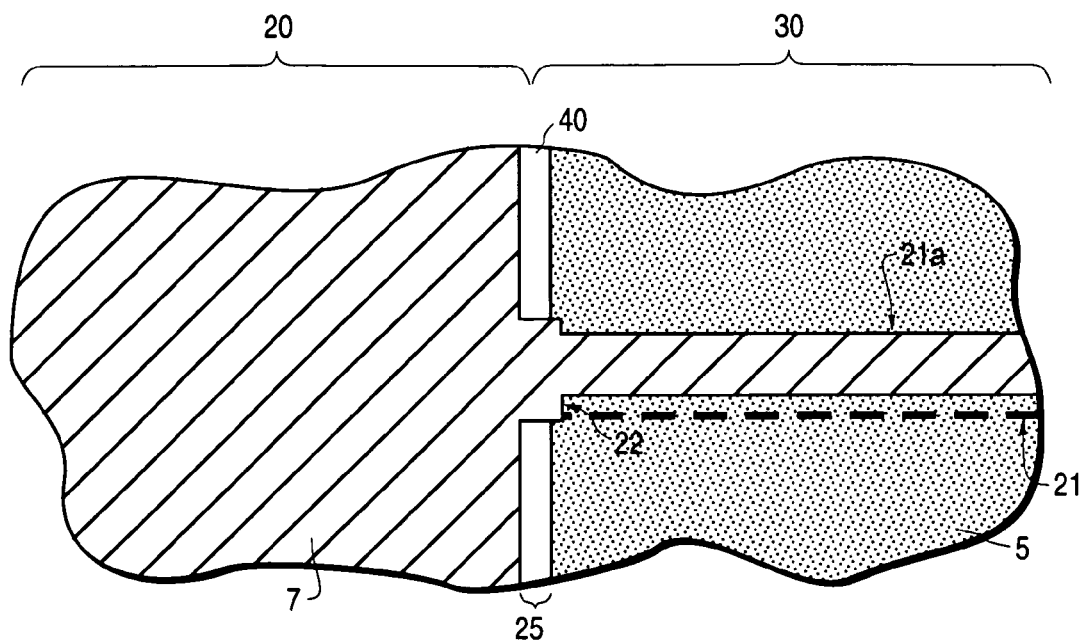
FIG. 2D shows a top view of the structure of FIG. 1F where a line crosses between the core region and the non-core region and illustrates how a second photoresist mask defines portions of the line in accordance with an embodiment of the present invention.

FIGS. 2A–2E illustrate how a line design 21, shown in FIG. 2A can be implemented using a dual mask process so as to prevent bridging and give good connections when there is alignment error between the two masks. As shown in FIG. 2B mask 6 does not cover narrow region 25 except where mask 6 defines line 21. This will cause the etch of core region 20 to etch region 25, forming the structure shown in FIG. 2C. This exposes the underlying field oxide layer 40. Mask 7 will not cover region 25 except where mask 7 defines line 21. Accordingly, portions of region 25 are etched during both etches. This double-etch prevents bridging of lines 21, even when there is significant mask misalignment.

Figure 2E:
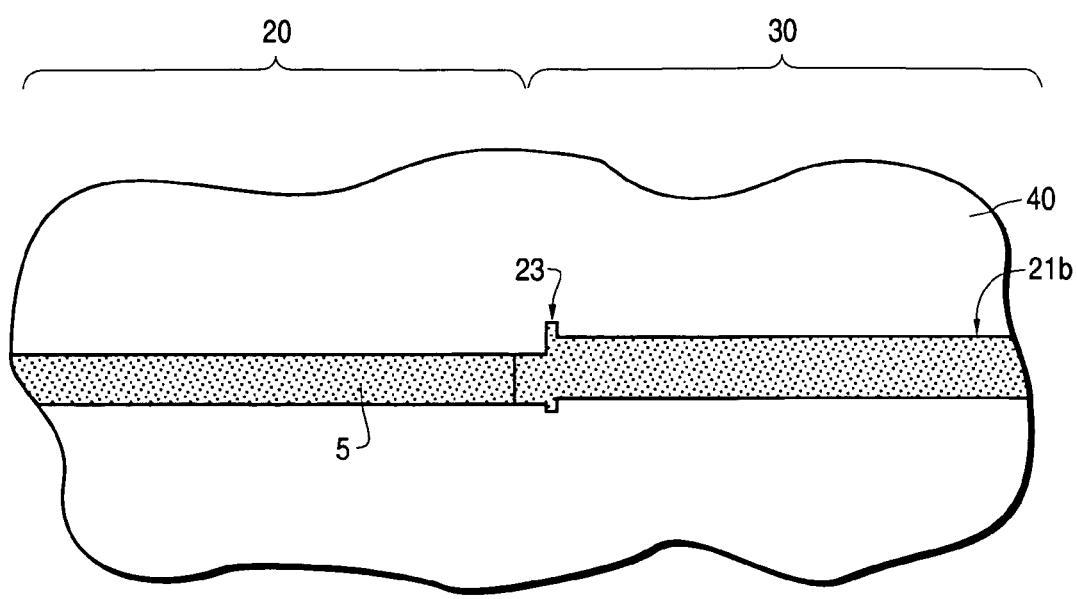
FIG. 2E shows a top view of the structure of FIG. 1G where a line (actual) crosses between the core region and the non-core region when there is misalignment between the two photoresist masks in accordance with an embodiment of the present invention.

Mask 6 and mask 7 overlap where lines cross between core region 20 and non-core region 30. In the embodiment shown in FIG. 2D, mask 7 defines line 21 by structure 21A in mask 7 and includes a broadened region 22 that has a "hammerhead" shape. Broadened region 22 is formed in mask 7 along each line 21a that extends between core region 20 and non-core region 30. Broadened region 22 extends within region 25 so as to form a broadened region 23 in each resulting line 21b, assuring good contact at the boundary, even when there is significant mask alignment error between the two masks in a direction perpendicular to line 21 as is illustrated in FIG. 2E.

FIGS. 3C–3F and 4A–4E illustrate an embodiment in which dielectric layer 2 and gate film stack 100 are patterned using dielectric layer 4 and ARC 5 as a masking structures to define gate structures and lines in both core region 20 and non-core region 30. In this embodiment, dielectric layer 2 and gate film stack 100 are formed in the same manner as shown in the embodiment illustrated in FIGS. 1A–1C, giving the same structure shown in FIG. 1C. In the present embodiment dielectric film 4 is a dielectric multi-layer film that includes both a dielectric hardmask 4b and one or more layers of Anti-Reflective Coating (ARC) 4a. Hardmask 4b can be a single layer of nitride or a single layer of oxide. ARC 4a can be one or more layers of inorganic material such as, for example, silicon oxynitride ($S_tO_xN_y$ and/or $Si_2O_2N$). Though ARC 4a is shown as a single layer that overlies hardmask 4b it is appreciated that ARC 4a could include multiple layers which may extend over and/or under hardmask 4b. Similarly, hardmask 4b could include multiple layers and may include layers of different material such as, for example, both a layer of nitride and a layer of oxide.

Figure 3A:
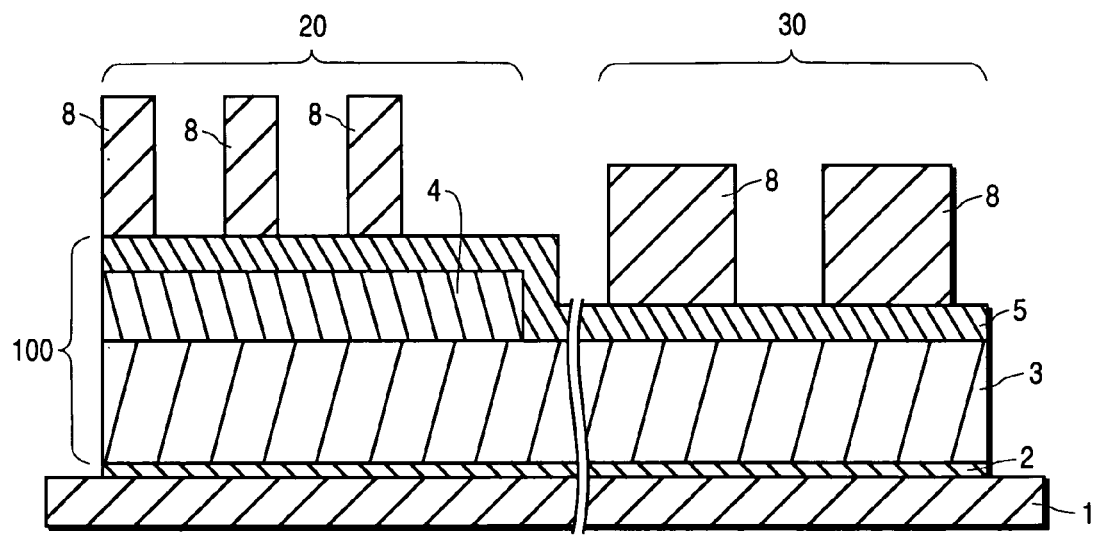
FIG. 3A shows a gate film stack that overlies a dielectric layer and that is thicker in the core region than in the non-core region, after a photoresist mask has been formed thereover, in accordance with an embodiment of the present invention.

Referring now to FIG. 3A, a mask 8 is formed that exposes portions of both core region 20 and non-core region 30. In the present embodiment mask 8 defines gate structures and defines lines within both core region 20 and non-core region 30. Mask 8 can be formed by depositing, exposing and developing a layer of photoresist so as to form a desired mask pattern. Because of the thickness differences between core region 20 and non-core region 30, in the present embodiment photolithography conditions are carefully controlled to closely match the critical dimension and photo resist profile between core region 20 and non-core region 30.

Figure 3B:
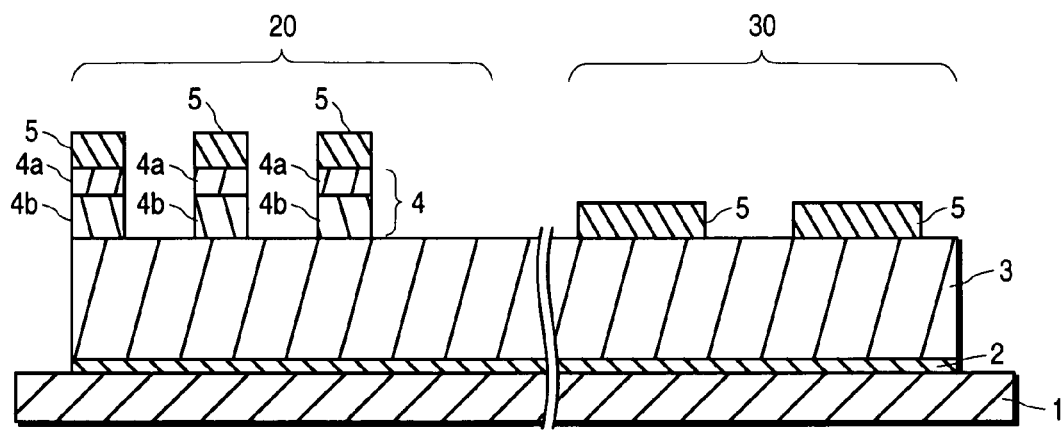
FIG. 3B shows the structure of FIG. 3A after a first selective etch has been performed and after removal of the photoresist mask in accordance with an embodiment of the present invention.

A selective etch is performed using an etch process that will selectively etch ARC 5 and dielectric film 4 over gate layer 3. More particularly, a selective etch process is used that will preferentially etch the materials of ARC 5 and dielectric film 4 over the material of gate layer 3. In one embodiment a fluorine based etch is performed in a poly-etch chamber that uses tetrafluoromethane ($CF_4$) and other fluorine-based chemistries. The etch chemistry is tuned (e.g., by altering ratios of etchant gasses and power) such that it will preferentially etch both silicon oxynitride and nitride (and/or oxide, depending on the composition of hardmask 4b) over polycide. This will etch exposed portions of ARC 5 and dielectric film 4 while not etching or minimally etching gate layer 3. FIG. 3B shows the structure of FIG. 3A after the selective etch has removed those portions of ARC 5 and dielectric film 4 that are not covered by mask 8. The remaining patterned ARC 5 and remaining patterned dielectric film 4 form a masking structure for subsequent process steps.

Figure 3C:
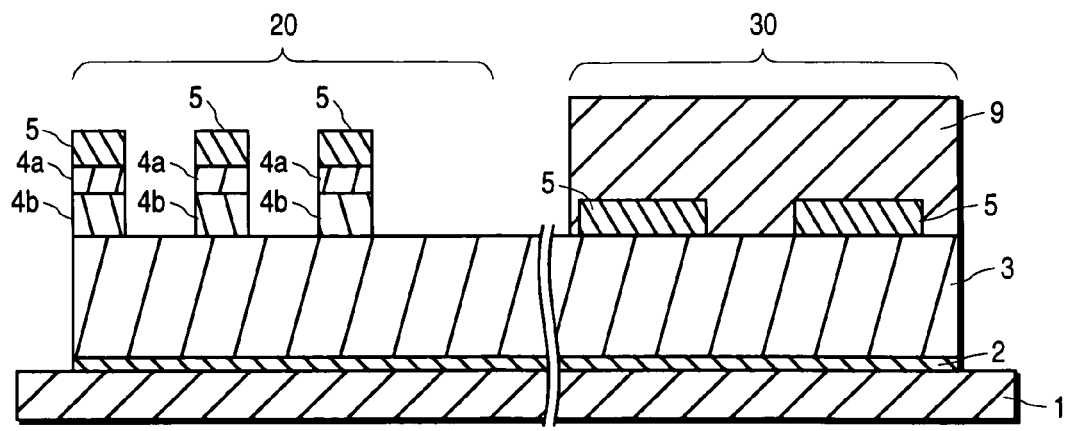
FIG. 3C shows the structure of FIG. 3B after a photoresist mask has been formed thereover in accordance with an embodiment of the present invention.
Figure 3D:
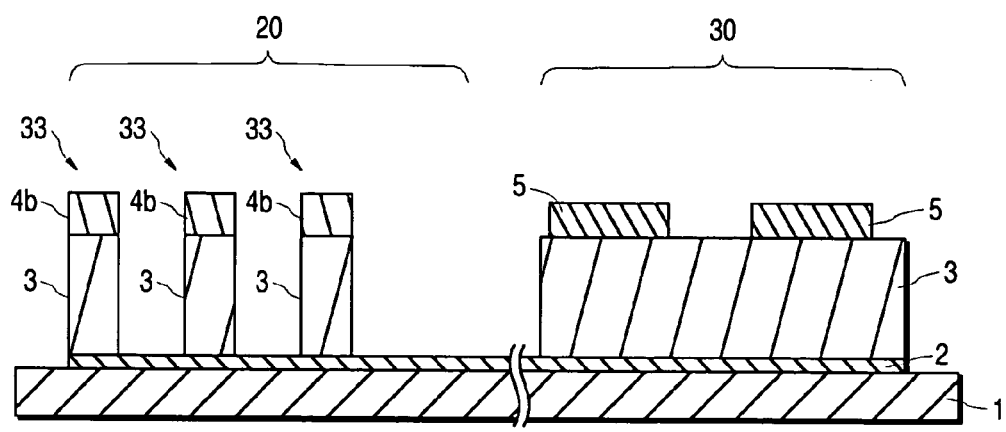
FIG. 3D shows the structure of FIG. 3C after a second selective etch has been performed and after removal of the photoresist mask in accordance with an embodiment of the present invention.

Referring now to FIG. 3C, a mask 9 is formed that covers non-core region 30 while exposing all of core region 20. Mask 9 can be formed by depositing, exposing and developing a layer of photoresist so as to form a desired mask pattern. In the present embodiment mask 9 covers all of non-core region 30 (completely covering all active areas within non-core region 30) except for a narrow gap 26 at the boundary between core region 20 and non-core region 30 where lines cross between core region 20 and non-core region 30.

A selective etch is then performed using an etch process that is selective to the material in gate layer 3 over the material in dielectric film 4 and in dielectric layer 2. In the present embodiment, an etch recipe is used that will preferentially etch polysilicon (and polycide) over nitride (and/or oxide, depending on the composition of hardmask 4b). In one embodiment a $Cl_2$/HBr-based etch is performed in a poly-etch chamber that uses, for example, $Cl_2$, HBr, $SF_6$, $HeO_2$, $N_2$, and $O_2$ gasses. The etch chemistry is tuned (e.g., by altering ratios of etchant gasses and power) to preferentially etch polysilicon while not etching nitride (and/or oxide, depending on the material used to form hardmask 4b) and dielectric layer 2 (silicon dioxide or other type of gate oxide). The etch removes the remaining ARC 5 in core region 20 and removes those portions of gate layer 3 that are not covered by mask 9 and that are not covered by remaining dielectric film 4, forming gate structures 33 shown in FIG. 3D. In the present embodiment an etch chemistry is used that also slowly etches silicon oxynitride, removing that portion of ARC 4a in dielectric film 4 that overlies hardmask 4b, leaving remaining hardmask 4b which extends over the remaining gate layer 3 in core region 20.

Figure 3E:
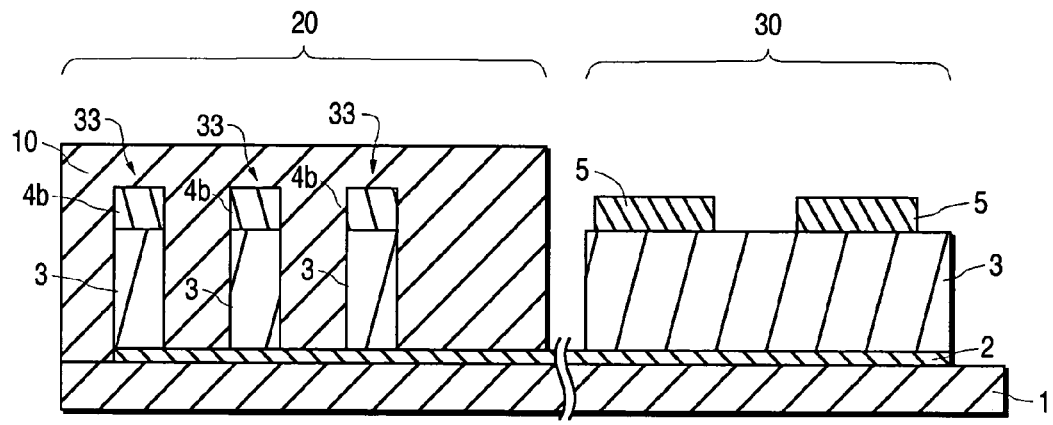
FIG. 3E shows the structure of FIG. 3D after a photoresist mask has been formed thereover in accordance with an embodiment of the present invention.
Figure 3F:
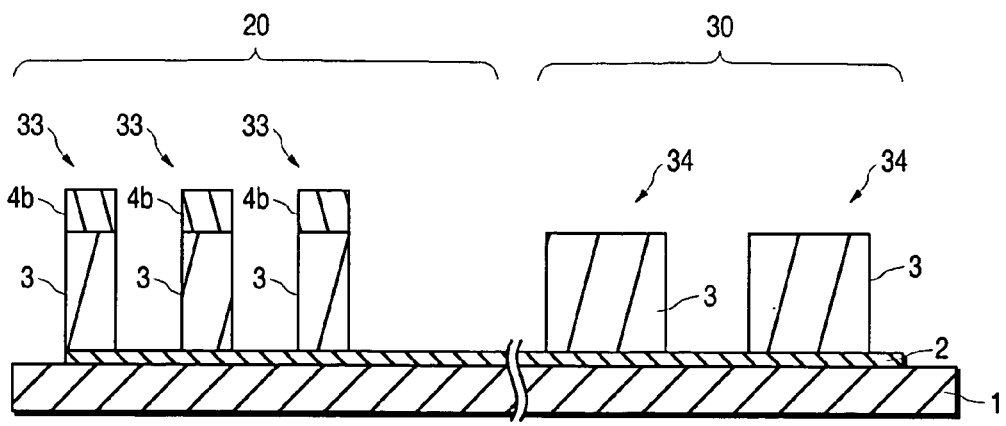
FIG. 3F shows the structure of FIG. 3E after a third selective etch has been performed and after removal of the photoresist mask in accordance with an embodiment of the present invention.

Referring now to FIG. 3E, a mask 10 is formed that covers core region 20 while exposing all of non-core region 30. Mask 10 can be formed by depositing, exposing and developing a layer of photoresist so as to form a desired mask pattern. In the present embodiment mask 10 covers all of core region 20 (completely covering all active areas within core region 20) except for a narrow gap 27 at the boundary between core region 20 and non-core region 30 where lines cross between core region 20 and non-core region 30.

A selective etch is then performed to define gate structures and polysilicon lines in non-core region 30. In the present embodiment an etch chemistry is used that is selective to the gate material over the ARC. In one embodiment a $Cl_2$/HBr-based etch is performed in a poly-etch chamber that uses, for example, $Cl_2$, HBr, $SF_6$, $HeO_2$, $N_2$, and $O_2$ gasses. The etch chemistry is tuned (e.g., by altering ratios of etchant gasses and power) to preferentially etch polycide (gate layer 3) while only minimally etching silicon oxynitride (ARC 5) and dielectric layer 2, so as to remove those portions of gate layer 3 in non-core region 30 that are not covered by remaining ARC 5. Preferably, the etch is performed until all of remaining ARC 5 is removed (or as little as possible remains), forming the structure shown in FIG. 3F.

Figure 4A:
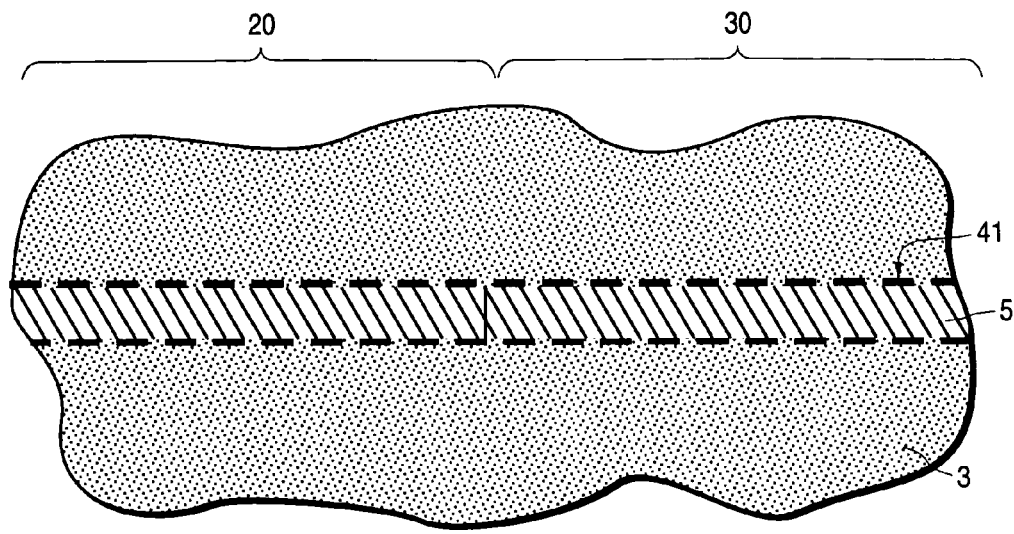
FIG. 4A shows a top view of the structure of FIG. 3B where a line (design) crosses between the core region and the non-core region in accordance with an embodiment of the present invention.
Figure 4B:
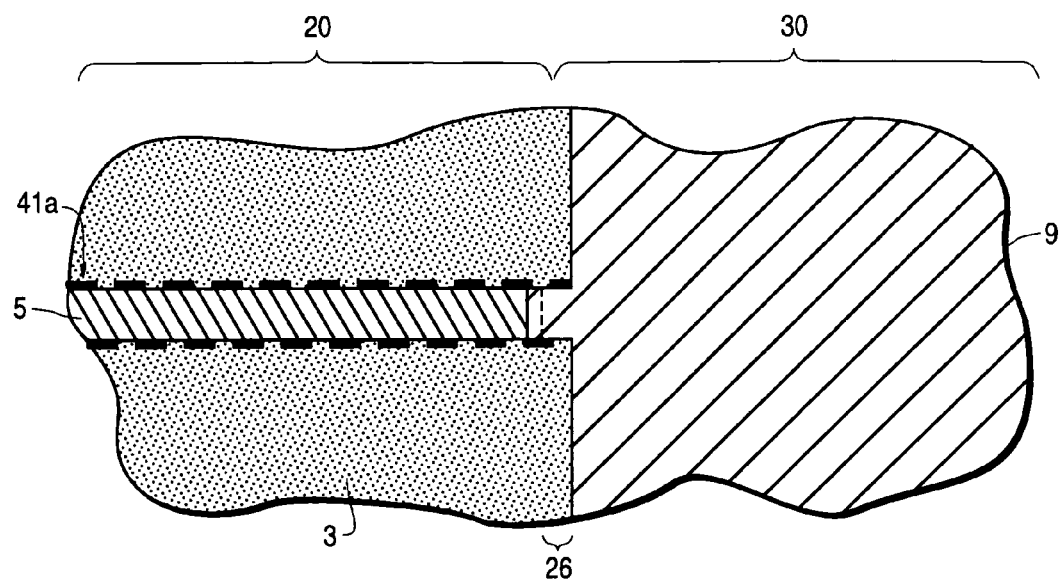
FIG. 4B shows a top view of the structure of FIG. 3C where a line crosses between the core region and the non-core region in accordance with an embodiment of the present invention.
Figure 4C:
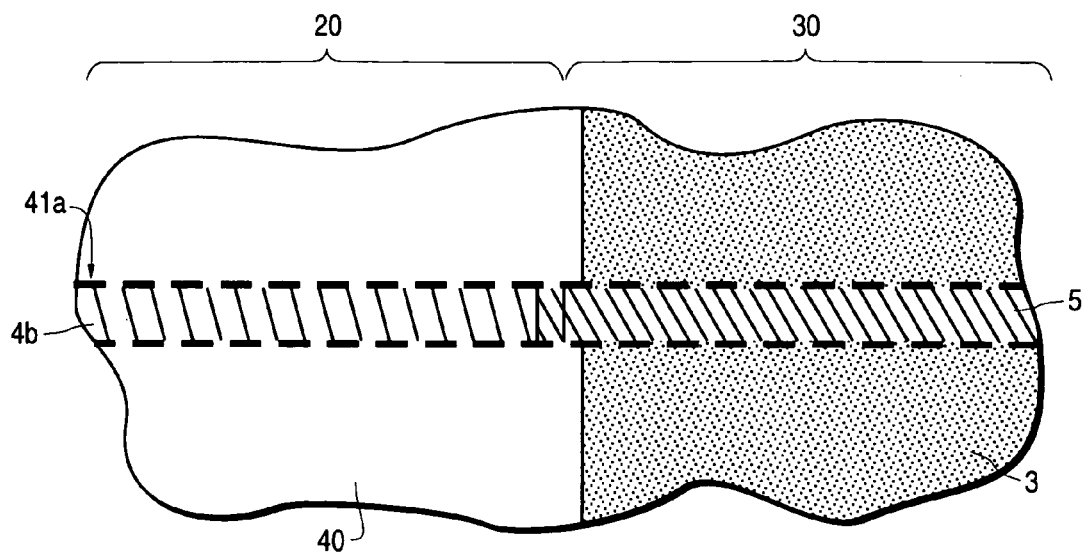
FIG. 4C shows a top view of the structure of FIG. 3D where a line crosses between the core region and the non-core region in accordance with an embodiment of the present invention.
Figure 4D:
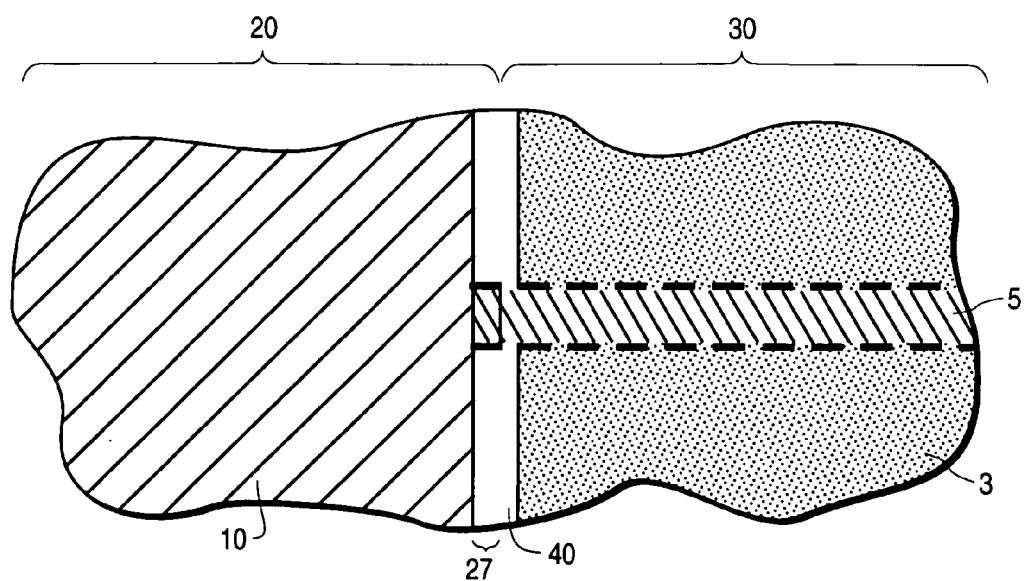
FIG. 4D shows a top view of the structure of FIG. 3E where a line crosses between the core region and the non-core region in accordance with an embodiment of the present invention.
Figure 4E:
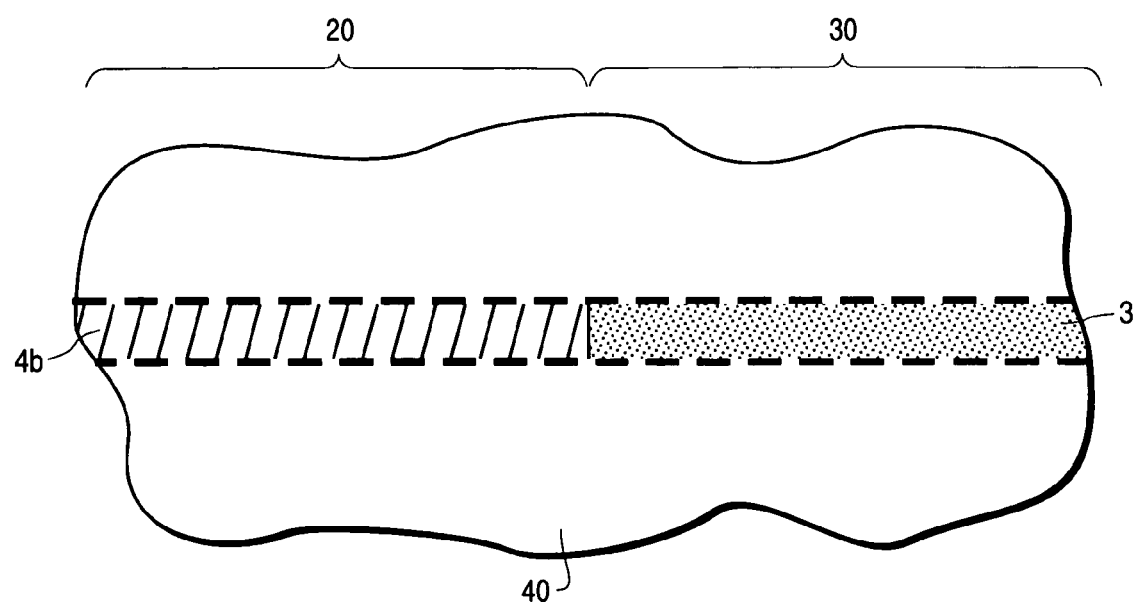
FIG. 4E shows a top view of the structure of FIG. 3F where a line (actual) crosses between the core region and the non-core region when there is misalignment between the two photoresist masks in accordance with an embodiment of the present invention.

FIGS. 4A–4E show how a line design 41, shown in FIG. 4A can be implemented that extends between core region 20 and non-core region 30. In the present embodiment, mask 8 defines line 41 by structure 41a in mask 8 such that the etch shown in FIG. 3B patterns ARC 5 (and underlying dielectric film 4), exposing portions of gale layer 3. As shown in FIG. 4B mask 9 does not cover gap 26. This will cause the etch of core region 20 to also etch gap 26, forming the structure shown in FIG. 4O. This exposes the underlying hardmask 4b and portions of the field oxide layer 40. Similarly, mask 10 does not cover a gap 27. Accordingly, portions of gaps 26–27 are etched during both etches. This double-etch prevents bridging of lines 41, even when there is significant mask misalignment. Line 41a is self-aligned as a result of the use of ARC 5 and dielectric film 4 to define line 41a. More particularly, misalignment between masks 9 and 10 will not alter the position of the line as its position is defined by the selective etch of ARC 5 and dielectric film 4.

Though the methods disclosed in FIGS. 1A–4E disclose a gate stack 100 that is thicker in core region 20 than in non-core region 30, it is appreciated that the methods disclosed for patterning gate stack 100 could be applied to other gate stack configurations. For example, these methods could be used to pattern a gate stack 100 that is thicker in non-core region 30 than in core region 20 or a gate stack 100 that is of uniform thickness. Also, it is appreciated that gate stack 100 could be formed using different materials from those used in FIGS. 1A–4E.

FIGS. 5A–6D disclose an embodiment in which a dielectric layer 2 is formed over semiconductor substrate 1 and in which a gate film stack 200 is formed that includes a gate layer 3 and a dielectric film 4. In the present embodiment dielectric layer 2 is formed by depositing or growing a dielectric material (e.g., $SiO_2$) over semiconductor 1 and gate film stack 200 is formed by depositing a gate layer 3 (e.g., undoped polysilicon or amorphous silicon) that includes an upper region that is more conductive than the remainder of gate layer 3 (e.g., polycide). Gate layer 3 is implanted (e.g., using an N-type dopant) within the core region and dielectric film 4 is formed. In the present embodiment dielectric film 4 is formed by depositing one or more layers of dielectric material over semiconductor substrate 1. In the embodiment shown in FIG. 5A dielectric film 4 is a dielectric multi-layer film that includes both a dielectric hardmask 4b (e.g., nitride or oxide) and one or more layers of Anti-Reflective Coating (ARC) 4a (e.g., silicon oxynitride). In one embodiment dielectric layer 2 and gate film stack 200 are formed in the same manner as in the embodiment shown in FIG. 1A.

Figure 5A:
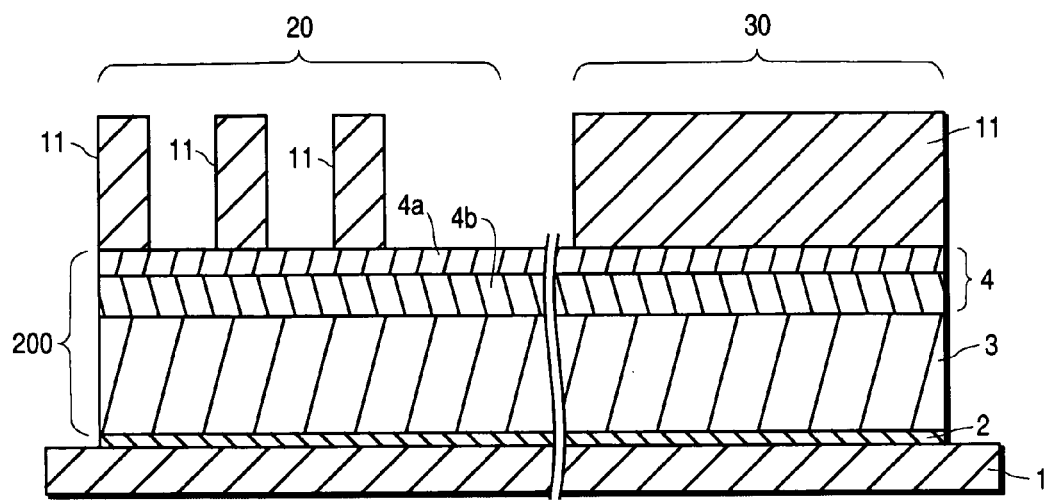
FIG. 5A shows a dielectric layer and a gate film stack that are formed on a semiconductor substrate, and a dielectric mask that overlies the gate film stack in accordance with an embodiment of the present invention.

The resulting gate film stack 200, shown in FIG. 5A is formed, at the same time, in both core region 20 and non-core region 30, and extends, at the same time, within all of core region 20 and non-core region 30. In the present embodiment gate layer 3 immediately overlies dielectric layer 2 and dielectric film 4 directly overlies gate layer 3, with each of dielectric layer 2, gate layer 3 and dielectric film 4 extending, at the same time, over semiconductor substrate 1. Gate film stack 200 has a thickness that is approximately the same throughout both core region 20 and non-core region 30. However, it is appreciated that the methods illustrated in FIGS. 5A–6D could be applied to embodiments in which gate film stack 200 is thicker in some or all of core region 20 or thicker in some or all of non-core region 30. Moreover, it is appreciated that gate film stack 200 could be formed using different materials from those disclosed in the present embodiment.

In the embodiment shown in FIGS. 5A–5G a resist mask is used to pattern non-core region 30 and dielectric film 4 is used as a mask during patterning of core region 20. Referring now to FIG. 5A, a mask 11 is formed that covers most of non-core region 30 and that exposes portions of core region 20. Mask 11 can be formed by depositing, exposing and developing a layer of photoresist so as to form a desired mask pattern. In the present embodiment mask 11 covers those portions of core region 20 that define gate structures and that define lines, and covers all of non-core region 30 (covering all active areas and lines defined within non-core region 30) except for a narrow gap at the boundary between core region 20 and non-core region 30 where lines cross.

Figure 5B:
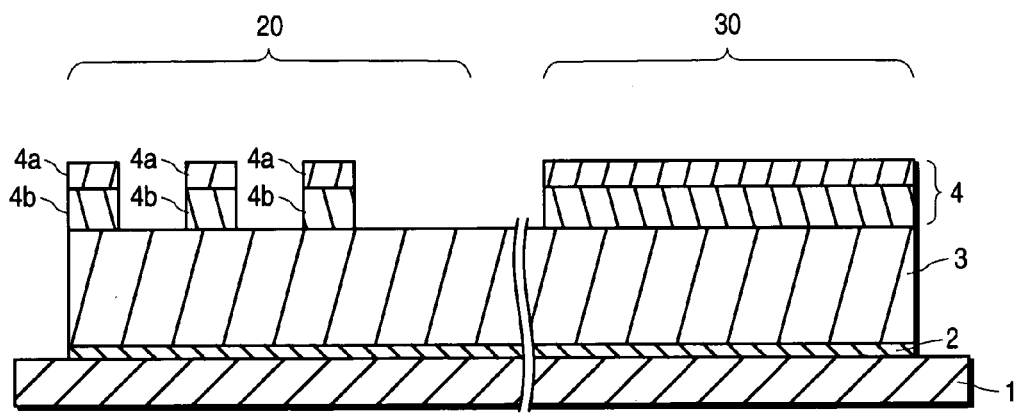
FIG. 5B shows the structure of FIG. 5A after a first selective etch has been performed and after removal of the photoresist mask in accordance with an embodiment of the present invention.
Figure 5C:
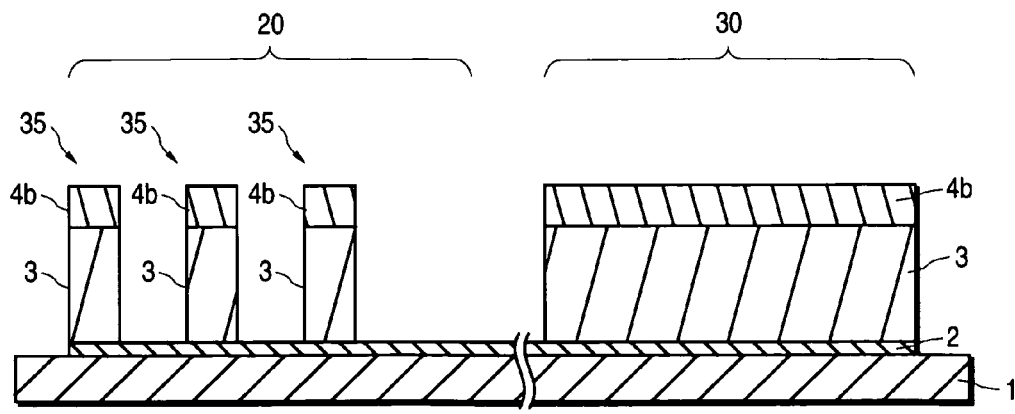
FIG. 5C shows the structure of FIG. 5B after a second selective etch has been performed in accordance with an embodiment of the present invention.

A selective etch is then performed using an etch process that will selectively etch dielectric film 4 over gate layer 3. More particularly, a selective etch process is used that will preferentially etch the materials of dielectric film 4 over the material of gate 3. In one embodiment a Fluorine-based etch is performed in a poly-etch or dielectric etch chamber. The etch chemistry is tuned (e.g., by altering ratios of etchant gasses and power) such that it will preferentially etch both silicon oxynitride (ARC 4a) and nitride (and/or oxide, depending on the composition of hardmask 4b) over polycide (gate film 3). This will etch exposed portions of dielectric film 4 while not etching or minimally etching gate film 3. FIG. 5B shows the structure of FIG. 5A after the selective etch has removed those portions of dielectric film 4 that are not covered by mask 11, leaving a remaining portion of dielectric film 4 that acts as a hardmask in subsequent process steps.

A selective etch is then performed using an etch process that is selective to the material in gate layer 3 over some or all of the material in dielectric film 4 and gate layer 2. In the present embodiment, an etch recipe is used that will preferentially etch polycide over nitride (and/or oxide, depending on the composition of hardmask 4b) and silicon dioxide. In one embodiment a $Cl_2$/HBr-based etch is performed in a poly-etch chamber that uses, for example, $Cl_2$, HBr, $SF_6$, $CF_4$, $HeO_2$, $N_2$ and $O_2$ gasses. The etch chemistry is tuned (e.g., by altering ratios of etchant gasses and power) to preferentially etch polycide while not etching nitride (and/or oxide, depending on the material used to form hardmask 4b) and silicon dioxide. In the present embodiment this etch also removes exposed silicon oxynitride (ARC layer 4a). Accordingly, the present etch will remove those portions of gate layer 3 that are not covered by remaining dielectric film 4, and will remove some or all of anti-reflective coating 4a. In the embodiment shown in FIG. 5C, all of the ARC 4a is removed, leaving hardmask 4b which extends over gate layer 3.

Figure 5D:
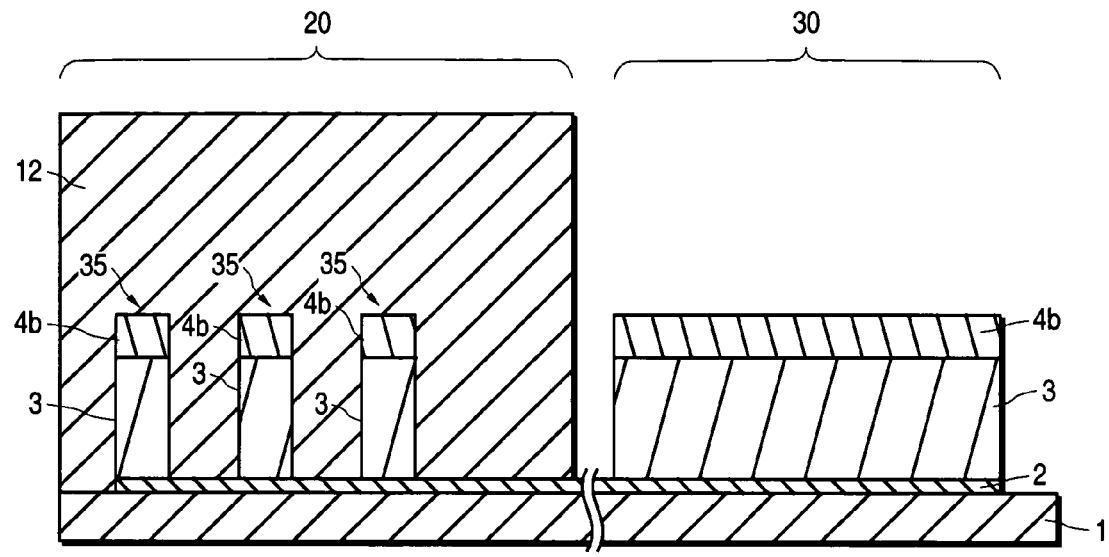
FIG. 5D shows the structure of FIG. 5C after a photoresist mask has been formed thereover in accordance with an embodiment of the present invention.
Figure 5E:
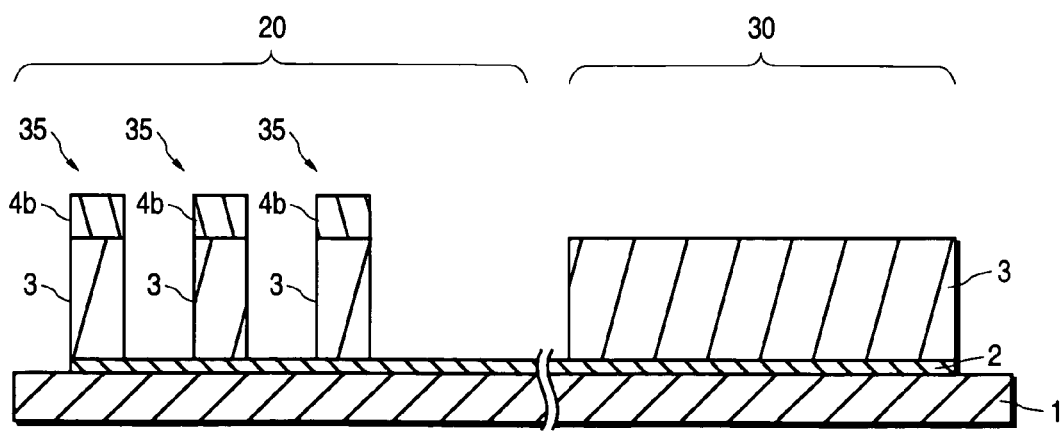
FIG. 5E shows the structure of FIG. 5D after an etch has been performed and after removal of the photoresist mask in accordance with an embodiment of the present invention.
Figure 5F:
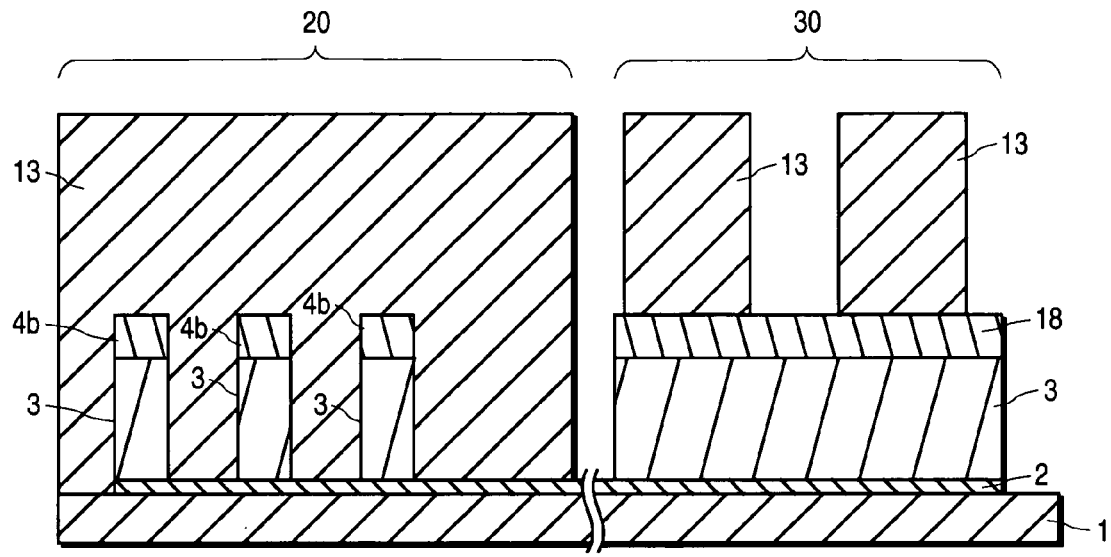
FIG. 5F shows the structure of FIG. 5E after a BARC layer has been deposited and after a photoresist mask has been formed in accordance with an embodiment of the present invention.
Figure 5G:
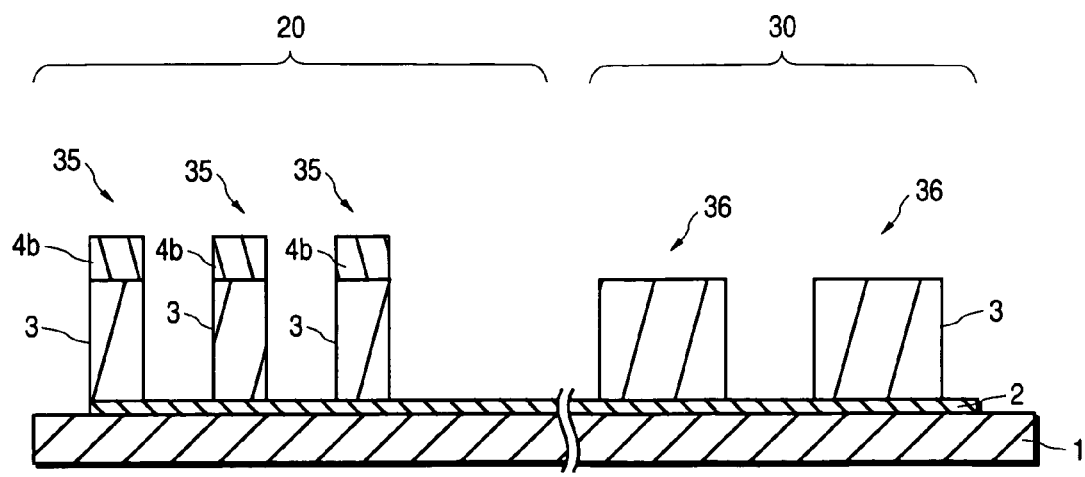
FIG. 5G shows the structure of FIG. 5F after an etch has been performed and after removal of the remaining BARC layer and photoresist mask in accordance with an embodiment of the present invention.

An etch is then performed using mask 12 shown in FIG. 5D to remove the remaining hardmask 4b in non-core region 30. Mask 12 covers all of core region 20 while exposing all of non-core region 30. Mask 12 can be formed by depositing, exposing and developing a layer of photoresist so as to form a desired mask pattern. In the present embodiment a $Cl_2$/HBr-based etch is performed in a poly-etch or dielectric etch chamber that uses, for example, $CF_4$, $CHF_3$, $CH_2F_2$, $N_2$, and O$_2$ gasses. This etch is performed until all of hardmask 4b in non-core region 30 is removed, forming the structure shown in FIG. 5E.

A resist mask 13 is formed that covers all of core region 20 while exposing portions of non-core region 30. A layer of inorganic Bottom Anti-Reflective Coating (BARC) 18 is then deposited. An etch is then performed to define gate structures 36. In the present embodiment a Cl$_2$/HBr-based etch is used to remove those portions of gate layer 3 that are not covered by mask 13. Remaining mask 13 and BARC 18 are then stripped, forming the structure shown in FIG. 5G.

In the present embodiment the gap in mask 11 where lines extend between core region 20 and non-core region 30 provides for double etching in the same manner as illustrated in FIGS. 2A–2E so as to prevent bridging between adjoining lines that extend between core region 20 and non-core region 30. Also, in the present embodiment mask 11 and mask 13 overlap near lines that extend between core region 20 and non-core region 30 in the same manner as shown in FIGS. 2A–2E, producing a broadened region, at the boundary between the core region 20 and non-core region 30, along each line that extends between core region 20 and non-core region 30.

FIGS. 6A–6D illustrate a method for forming self-aligned contact devices in a core region and non-self-aligned contact devices in a non-core region of a semiconductor substrate in which dielectric layer 2 and gate film stack 200 are formed in the same manner as in the embodiment illustrated in FIG. 5A. This forms a gate film stack 200 that includes gate layer 3 and dielectric film 4 having one or more layers of ARC 4a and one or more layers of hardmask 4b.

Figure 6A:
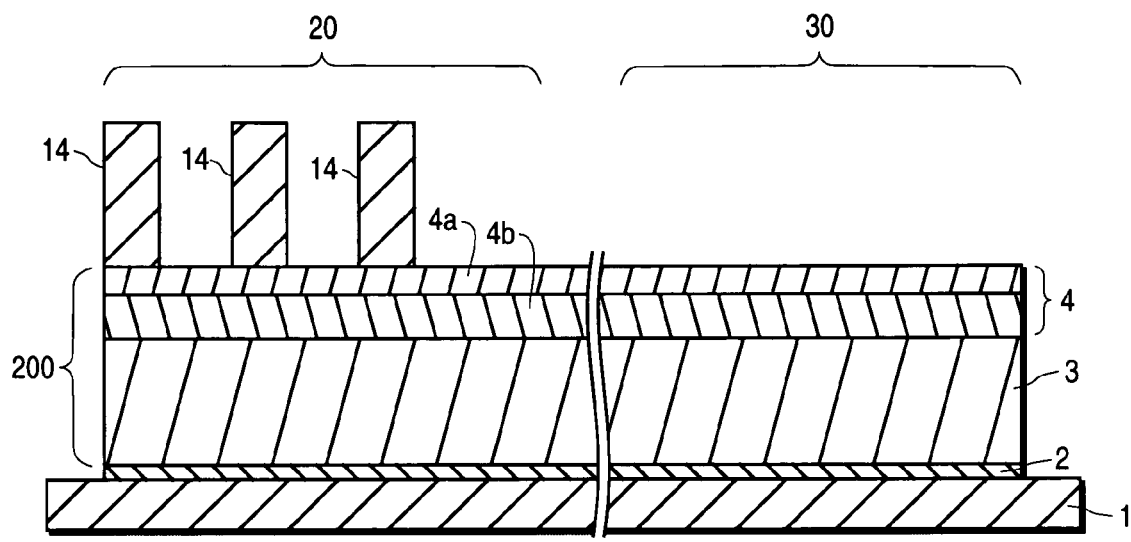
FIG. 6A shows a dielectric layer and a gate film stack that are formed on a semiconductor substrate and a photoresist mask that overlies the gate film stack in accordance with an embodiment of the present invention.
Figure 6B:
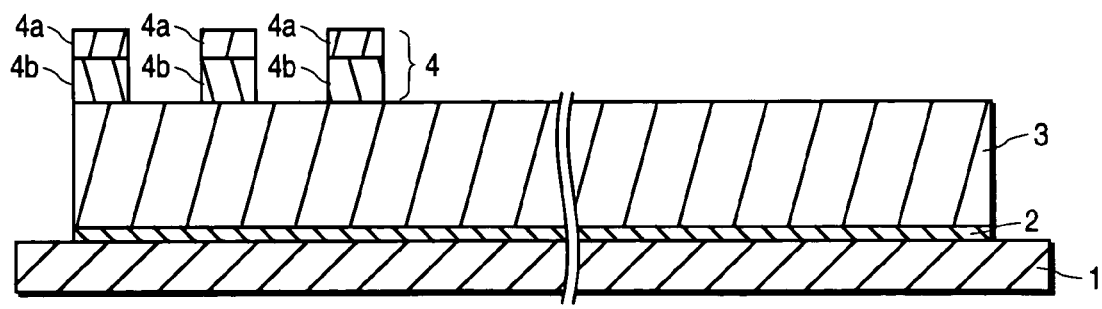
FIG. 6B shows the structure of FIG. 6A after a first selective etch has been performed and after removal of the photoresist mask in accordance with an embodiment of the present invention.

Referring now to FIG. 6A, mask 14 is disposed over gate film stack 200 such that it exposes portions of core region 20 and all of non-core region 30. Mask 14 can be formed by depositing, exposing and developing a layer of photoresist so as to form a desired mask pattern. In the present embodiment mask 14 defines gate structures and lines within core region 20 and includes a narrow gap at the boundary between core region 20 and non-core region 30 where lines cross between core region 20 and non-core region 30.

A selective etch is then performed using an etch process that will selectively etch dielectric film 4 over gate layer 3. More particularly, a selective etch process is used that will preferentially etch the materials of dielectric film 4 over the material of gate 3. In one embodiment a fluorine based etch is performed in a poly-etch chamber that uses CF$_4$, CHF$_3$, C$_2$F$_2$, N$_2$, and O$_2$ gasses. The etch chemistry is tuned (e.g., by altering ratios of etchant gasses and power) such that it will preferentially etch both silicon oxynitride (ARC 4a) and nitride (and/or oxide, depending on the composition of hardmask 4b) over polycide (gate film 3). This will etch exposed portions of dielectric film 4 while not etching or minimally etching gate film 3, removing those portions of dielectric film 4 that are not covered by mask 14 so as to leave a remaining portion of dielectric film 4, shown in FIG. 6B, that acts as a mask in subsequent process steps.

Figure 6C:
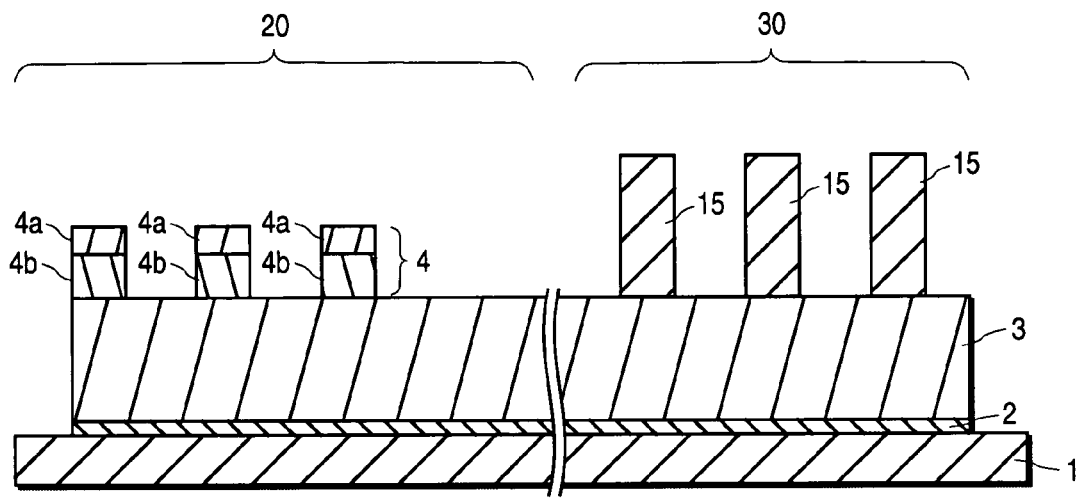
FIG. 6C shows the structure of FIG. 6B after a photoresist mask has been formed thereover in accordance with an embodiment of the present invention.
Figure 6D:
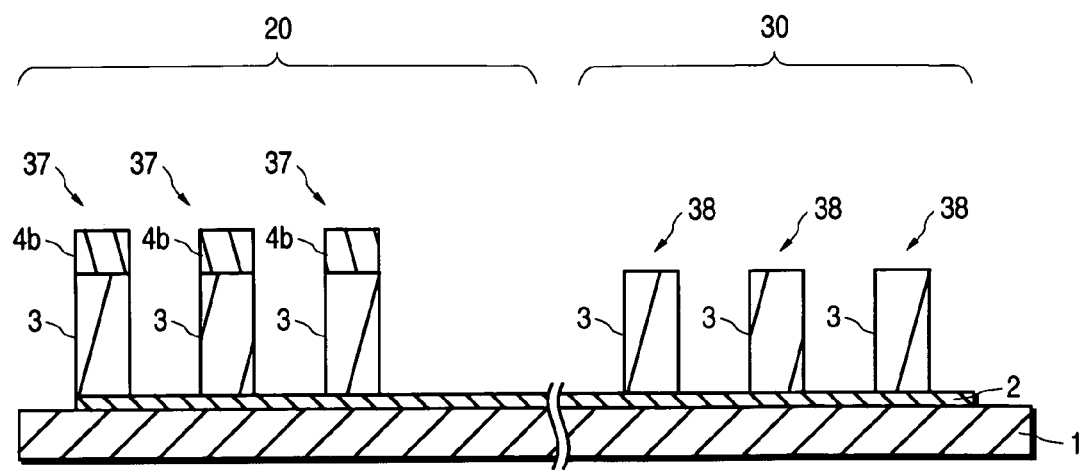
FIG. 6D shows the structure of FIG. 6C after a second selective etch has been performed and after removal of the photoresist mask in accordance with an embodiment of the present invention.

A selective etch is then performed using mask 15 shown in FIG. 6C. Mask 15 covers portions of non-core region 30, exposing all of core region 20. Mask 15 can be formed by depositing, exposing and developing a layer of photoresist so as to form a desired mask pattern. In the present embodiment mask 15 defines gate structures and lines in non-core region 30 and includes a narrow gap at the boundary between core region 20 and non-core region 30 where lines cross between core region 20 and non-core region 30.

An etch process is used that is selective to the material in gate layer 3 over some or all of the material in dielectric film 4 and in dielectric layer 2. In the present embodiment, an etch recipe is used that will preferentially etch polycide over nitride (and/or oxide, depending on the composition of hardmask 4b) and silicon dioxide. In one embodiment a Cl$_2$/HBr-based etch is performed in a poly-etch chamber that uses, for example, Cl$_2$, HBr, SF$_6$, CF$_4$, HeO$_2$, O$_2$ and N$_2$ gasses. The etch chemistry is tuned (e.g., by altering ratios of etchant gasses and power) to preferentially etch polycide while not etching nitride (and/or oxide, depending on the material used to form hardmask 4b) and silicon dioxide. In the present embodiment this etch also removes exposed silicon oxynitride (ARC layer 4a). Accordingly, the present etch will remove those portions of gate layer 3 that are not covered by either remaining dielectric film 4 or etch mask 15, and will remove some or all of anti-reflective coating 4a. In the present embodiment, all of the ARC 4a is removed, leaving hardmask 4b which extends over gate layer 3, so as to define both gate structures 37 and gate structures 38 shown in FIG. 6D.

In the present embodiment both mask 14 and mask 15 include a narrow gap where lines cross between core region 20 and non-core region 30. Also, masks and 14 and masks 14 and 15 overlap in the same manner as illustrated in FIGS. 4A–4E, thereby preventing bridging of lines and giving good electrical connection at the mask boundary, even when there is significant mask misalignment.

Though the methods disclosed in FIGS. 1A–6D disclose the use of a dielectric film 4 that includes ARC (silicon oxynitride) and a hardmask (nitride or oxide), it is appreciated that dielectric film 4 could be formed using any of a number of other materials. Furthermore, any of a number of different etch process could be used, as long as the materials and etch processes used would allow for one or more etch that will preferentially etch the material in dielectric film 4 over the material in gate layer 3, and would allow for one or more etch that will preferentially etch the material in gate layer 3 over dielectric film 4.

Conventional process steps can now be used to form SAC devices using gate structures 31, 33, 35, 37. More particularly, source and drain regions can be formed in core area 20 and overlying structures can be formed (using conventional self aligned contact fabrication processes) that couple to gate structures 31, 33, 35 and 37 and/or source and drain regions using self aligned contacts. Gate structures 32, 34, 36 and 38 in non-core region 30 are not as closely spaced as are gate structures 31, 33, 35 and 37 formed in core region 20. Accordingly, conventional dual-gate processes can be used to form non-SAC devices in non-core region 30 using gate structures 32, 34, 36 and 38. In the present embodiment N-type devices and P-type devices are formed in non-core region 30 using gate structures 32, 34, 36 and 38 that use processes other than SAC processes and that use methods for connection to overlying structures other than self-aligned contacts.

The methods of the present invention utilizes a single gate film stack for forming gate structures in the core region and in the non-core region, forming a semiconductor device having both SAC and non-SAC devices. The resulting semiconductor device has the advantages of high density in the core region and high speed in the non-core region.

The preferred embodiment of the present invention is thus described. While the present invention has been described in particular embodiments, it should be appreciated that the present invention should not be construed as limited by such embodiments, but rather construed according to the following claims.

What is claimed is:

1. A method for forming self-aligned contact devices in a first region of a semiconductor substrate and non-self-aligned contact devices in a second region of said semiconductor substrate comprising:
   forming a dielectric layer that extends within said first region and within said second region;
   forming a gate film stack that includes a gate layer and that includes a dielectric film that overlies said gate layer, said gate film stack extending within said first region and within said second region; and
   patterning said gate film stack, using a first etch mask that covers portions of said first region and more than half of said second region, and using a second etch mask that covers all of said first region and portions of said second region, to define gate structures in said first region and in said second region.

2. The method of claim 1 wherein said gate film stack is a single gate film stack that extends, at the same time, within both said first region and said second region, said patterning said gate film stack removing portions of said gate film stack and said dielectric layer.

3. The method of claim 1 wherein said gate film stack is thicker in said first region than in said second region.

4. The method of claim 3 wherein said gate layer comprises polycide, said patterning said gate film stack forming polycide lines that extend between said first region and said second region.

5. The method of claim 4 wherein said first etch mask and said second etch mask overlap so as to form a broadened region along lines that cross between said first region and said second region.

6. The method of claim 4 wherein said forming a gate film stack further comprises:
   forming said gate layer such that said gate layer extends within said first region and within said second region;
   implanting species within said first region so as to form an N-type gate layer in said first region;
   forming said dielectric film such that said dielectric film extends within said first region and within said second region;
   removing that portion of said dielectric film that extends within said second region; and
   depositing anti-reflective material so as to form an anti-reflective coating that extends within said first region and within said second region.

7. The method of claim 3 wherein said gate film stack includes an anti-reflective coating, said dielectric film only extending within said first region and said anti-reflective coating extending within both said first region and said second region, said patterning said gate film stack further comprising:
   performing a first selective etch so as to pattern said anti-reflective coating and said dielectric film, within both said first region and said second region;
   performing a second selective etch to remove those portions of said gate layer, within said first region, that are not covered by remaining anti-reflective coating and said dielectric film, and
   performing a third selective etch that removes those portions of said gate layer, within said second region, that are not covered by remaining anti-reflective coating.

8. The method of claim 7 wherein said anti-reflective coating comprises multiple layers of anti-reflective material and wherein said dielectric film comprises a dielectric hardmask layer and a layer of anti-reflective material.

9. The method of claim 1 wherein only N-type semiconductor devices are formed within said first region and wherein both N-type devices and P-type devices are formed in said second region.

10. A method for forming self-aligned contact devices in a first region of a semiconductor substrate and non-self-aligned contact devices in a second region of said semiconductor substrate comprising:
    forming a dielectric layer that extends within said first region and within said second region;
    forming a single gate film stack that includes a gate layer and that includes a dielectric film that overlies said gate layer, said single gate film stack extending within said first region and within said second region; and
    patterning said single gate film stack so to form gate structures in said first region and in said second region, said patterning said single gate film stack further including:
       performing a first selective etch, using a first etch mask that covers more than half of said second region and that covers portions of said first region, so as to remove that portion of said dielectric film that is not covered by said first etch mask;
       performing a second selective etch so as to remove those portions of said gate layer that are not covered by remaining dielectric film;
       removing that portion of said dielectric film that extends within said second region using a second etch mask;
       depositing an anti-reflective coating; and
       performing an etch, using a third etch mask, so as to form said gate structures in said second region.

11. The method of claim 10 wherein said dielectric film comprises a dielectric hardmask layer and a layer of anti-reflective material.

12. A method for forming self-aligned contact devices in a first region of a semiconductor substrate and non-self-aligned contact devices in a second region of said semiconductor substrate comprising:
    forming a dielectric layer that extends within said first region and within said second region;
    forming a single gate film stack that includes a gate layer and that includes a dielectric film that overlies said gate layer, said single gate film stack extending within said first region and within said second region; and
    patterning said single gate film stack so to form gate structures in said first region and in said second region, by performing a first selective etch using a first etch mask that covers portions of said first region and does not cover any of said second region so as to remove all of said dielectric film in said second region and to remove those portions of said dielectric film in said first region that are not covered by said first etch mask and by performing a second selective etch, using a second etch mask that covers portions of said second region and that does not cover any of said first region, so as to remove those portions of said gate layer that are not covered by said dielectric film or said second etch mask.

* * * * *

UNITED STATES PATENT AND TRADEMARK OFFICE
CERTIFICATE OF CORRECTION

| | |
|---|---|
| PATENT NO. | : 7,125,775 B1 |
| APPLICATION NO. | : 10/805124 |
| DATED | : October 24, 2006 |
| INVENTOR(S) | : Wang et al. |

Page 1 of 1

It is certified that error appears in the above-identified patent and that said Letters Patent is hereby corrected as shown below:

Column 4, line 59 the word "substrates" should read --substrate 1--
Column 9, line 15 the word "gale" should read --gate--

Signed and Sealed this

Nineteenth Day of December, 2006

JON W. DUDAS
*Director of the United States Patent and Trademark Office*